US006614255B2

(12) United States Patent
Hassan

(10) Patent No.: US 6,614,255 B2
(45) Date of Patent: Sep. 2, 2003

(54) DIGITAL METHOD OF MEASURING DRIVER SLEW RATES FOR REDUCED TEST TIME

(75) Inventor: Mehedi Hassan, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/683,661

(22) Filed: Jan. 31, 2002

(65) Prior Publication Data

US 2003/0141891 A1 Jul. 31, 2003

(51) Int. Cl.$^7$ .............................................. G01R 31/34
(52) U.S. Cl. ..................... 324/772; 324/158.1; 318/560
(58) Field of Search ............................... 324/107, 112, 324/158.1, 545, 546, 772; 318/254, 560, 599, 663; 360/51, 73.01, 73.11, 78.13, 266.4

(56) References Cited

U.S. PATENT DOCUMENTS 5,821,717 A * 10/1998 Hassan et al. .............. 318/560
5,856,733 A * 1/1999 Matsumoto et al. ........ 318/663
5,866,998 A * 2/1999 Menegoli .................... 318/254
5,909,095 A * 6/1999 Sakti et al. ................. 318/254
5,986,426 A * 11/1999 Rowan ........................ 318/599
6,236,174 B1   5/2001 White
6,441,981 B1 * 8/2002 Cloke et al. .................. 360/51

* cited by examiner

Primary Examiner—Kamand Cuneo
Assistant Examiner—Minh N. Tang
(74) Attorney, Agent, or Firm—W. Daniel Swayze, Jr.; W. James Brady; Frederick J. Telecky, Jr.

(57) ABSTRACT

A circuit combination (16,86) is presented for providing digital signals indicative of slew rates of drive signals (112,140) provided to H-bridge power drive transistors (60,62,64) of motor windings (66) of a mass data storage device (10). The circuit combination includes a plurality of predriver circuits (53–55) producing predrive signals according to a commutation sequence for connection to respective the power drive transistors (60,62,64). A multiplexer (40) is connected to selectively direct at least some of the drive signals to a multiplexer output port, and a digital comparison circuit (86) receives the at least some drive signals from the multiplexer output port and produces a digital outputs (120,158) having state time changes in dependence upon rise and fall times of the predriver output signals.

20 Claims, 7 Drawing Sheets

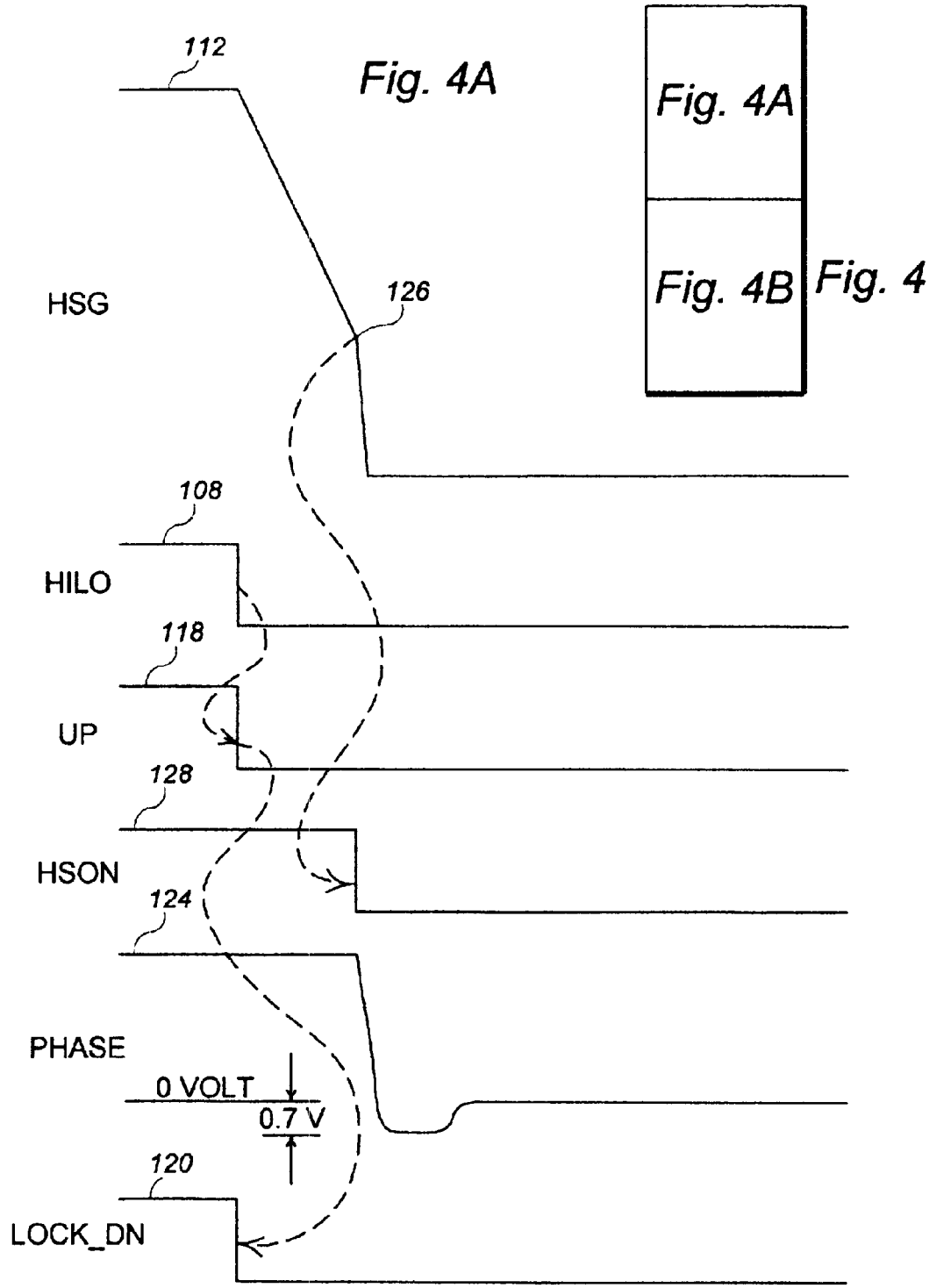

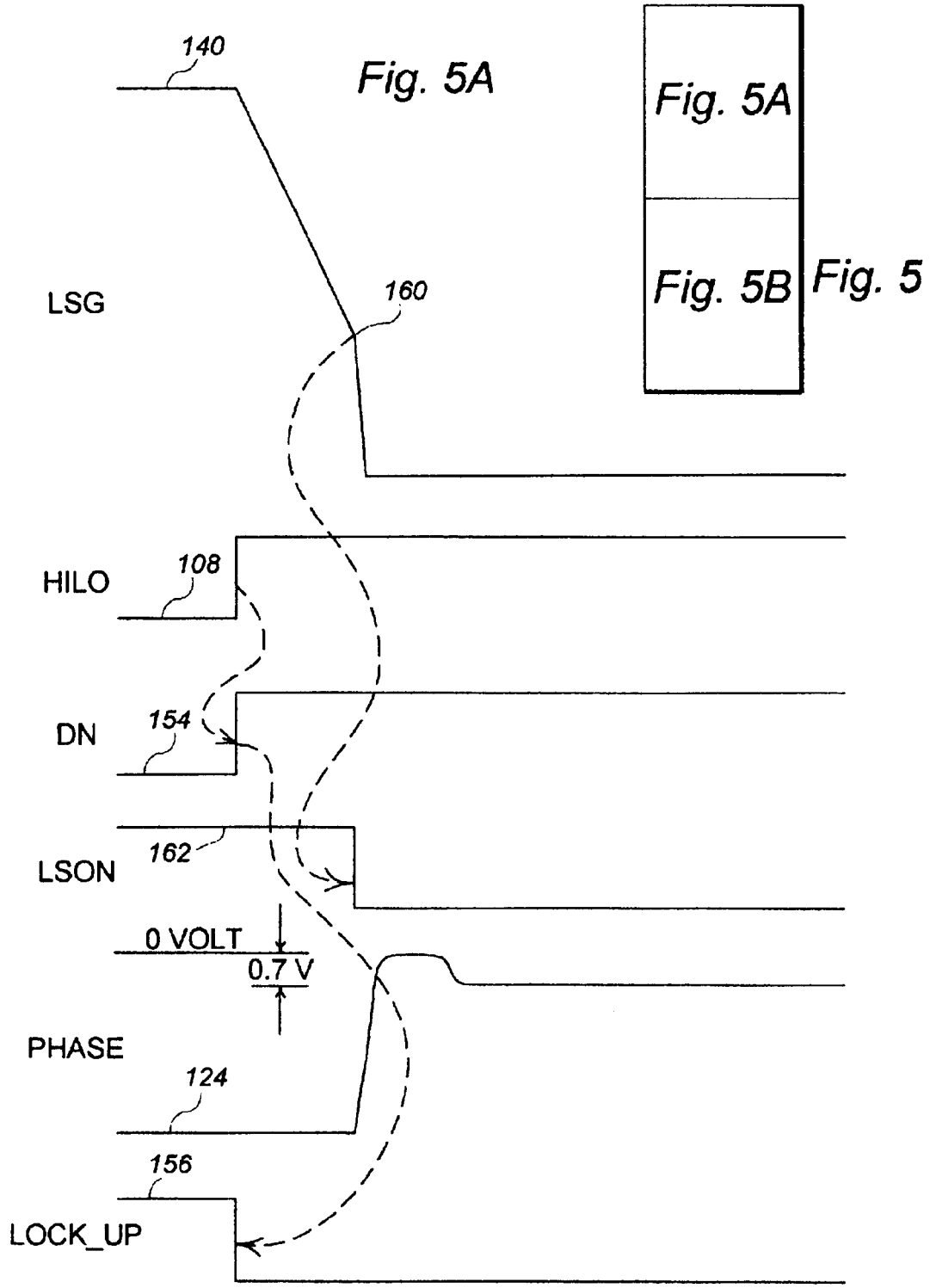

DIGITAL METHOD OF MEASURING DRIVER SLEW RATES FOR REDUCED TEST TIME

BACKGROUND OF INVENTION

1. Field of Invention

This invention relates generally to improvements in methods and apparatuses for dynamic information storage or retrieval, and more specifically to improvements in circuits for use in mass data storage devices to measure the slew rate of signals at motor driver transistors to facilitating testing of the circuitry of the mass data storage device.

2. Relevant Background

Mass data storage devices include tape drives, as well as hard disk drives that have one or more spinning magnetic disks or platters onto which data is recorded for storage and subsequent retrieval. Hard disk drives may be used in many applications, including personal computers, set top boxes, video and television applications, audio applications, or some mix thereof. Applications for hard disk drives still being developed, and are expected to further increase in the future.

Mass data storage devices may also include optical disks in which the optical properties of a spinning disk are locally varied to provide a reflectivity gradient that can be detected by a laser transducer head, or the like. Optical disks may be used, for example, to contain data, music, or other information.

Such mass data storage devices typically have a polyphase motor, usually a three-phase motor, that has a spindle that rotates the memory media. The motor is typically controlled by a DMOS power H-bridge circuit to which drive voltages are commutatively applied to drive currents through the motor coils in a known manner. Typically the H-bridge has a number of "high-side" and "low-side" driver transistors that respectively connect the commutatively selected coil combinations to a power source and ground. More specifically, the coils are typically connected in a "Y" configuration, with a common end of each coil interconnected, and with the other ends connected between the respective high and low DMOS devices in each H-bridge power transistor pair. Thus, the unconnected ends of the motor coils are typically connected in a known sequence among a power source and ground, with the third phase floating or connected to a tri-state impedance.

During commutation, however, to ensure that transistors that connect the selected coil to the power source and ground in the same phase are not simultaneously conducting (an undesirable condition known as shoot-through), the driving voltages are usually slewed at a predetermined rate. This slew rate may be programmable in some applications, and may be factory set in others. In any event, it is important to know the slew rate in testing the device to ensure that the motor will properly perform. Since the DMOS devices of the power transistor H-bridge are generally large devices, a large capacitance may be associated with the gate elements of the DMOS devices. Such large capacitances also may affect the slew rate, and may cause the motor to not properly perform, which is another reason that the slew rate should be measured or tested before the motor is put into service.

However, in a Spindle/VCM driver IC with on chip power DMOS devices, a large amount of test time may be required to measure the charge and discharge capabilities of, the DMOS predrivers. Since the predriver outputs are not brought out to externally accessible pins, extra hardware may be required for the test board to be enabled to provide a suitable measurement method. It also takes a lot of time to measure the analog currents and voltages that appear between the H-bridge power devices and the predriver circuitry.

What is needed, therefore, is a method and apparatus for easily measuring the voltages and currents between the H-bridge power devices and the predriver circuitry, and more particularly to a method and apparatus that simplifies the measurement of the slew rate of the driving voltages in devices of the type to which the invention pertains.

SUMMARY OF INVENTION

In light of the above, therefore, it is an object of the invention to provide a digital circuit to measure the rise and fall times of predriver signals of a spindle driver circuit.

It is another object of the invention to provide a circuit that develops a timing window in which the rise and fall times are determined.

It is another object of the invention to provide a circuit that can reduce test time, resulting in the advantage that more flexibility can be achieved for spindle pre-driver testing.

It is another object of the invention to provide a circuit that includes variations in the power DMOS gate capacitances.

It is another object of the invention to provide a circuit that enables a faster slew rate measurement.

These and other objects, features and advantages of the invention will be apparent to those skilled in the art from the following detailed description of the invention, when read in conjunction with the accompanying drawings and appended claims.

This invention uses certain signals from the Spindle Predrivers that are indicative of the beginning of charge/discharge as well as the end. These signals are then initially processed to provide a timing window which determines the predrivers rise and fail times.

The approach followed by the circuit a method of the invention requires capturing of digital output through a MUX and measuring the timing of those signals to provide spindle pre-drivers slew rates. This minimizes any hardware changes and reduces test time significantly when the pre-driver outputs are not accessible, for example, because of integrated power DMOS in the IC.

Using the circuit of the invention for measuring digital output parameters, and more particularly, of the gate charge and discharge rates, will cut down the test time significantly. This circuit provides a digital signal whose timing provides the equivalent current and voltage information of the pre-drivers. By measuring the timing of digital signals, which may be brought out through a digital multiplexer pin, which in most cases exists for other purposes, test time can be significantly reduced, and much more flexibility can be achieved for spindle pre-driver testing.

In contrast to the presently employed analog techniques where as the gate charge and discharge currents are measured via an analog multiplexer pin with external hardware modification, the circuit and method of the invention eliminates the need for these, and a faster measurement can be made. Moreover, the invention enables the true slew rate for the gates to be determined, including variations in the gate capacitance of the power DMOS gates. Also, the invention, in contrast to previously employed analog measurement techniques, is free of variations in the gate capacitance of integrated power DMOS devices, which have wide process variations.

According to a broad aspect of the invention, a circuit is presented for providing digital signals indicative of slew rates of motor driver signals. The circuit includes a multiplexer connected to direct at least some of the driver signals to a multiplexer output port and a digital comparison circuit for receiving the driver signals on the multiplexer output port and for producing a digital output having signal changes in dependence upon rise and fall times of the driver signals.

According to another broad aspect of the invention, a circuit combination is presented for providing digital signals indicative of slew rates of drive signals provided to H-bridge power drive transistors of a motor of a mass data storage device. The circuit combination includes a plurality of predriver circuits producing predrive signals according to a commutation sequence for connection to respective the power drive transistors. A multiplexer is connected to selectively direct at least some of the drive signals to a multiplexer output port, and a digital comparison circuit for receiving the at least some drive signals from the multiplexer output port and for producing a digital output having signal changes in dependence upon rise and fall times of the predriver output signals.

According to yet another broad aspect of the invention, a circuit combination is presented for providing digital signals indicative of slew rates of predrive signals in a motor driver circuit. The circuit combination includes an integrated circuit chip which has DMOS power driver transistors connected in an H-bridge configuration having a plurality of high-side drivers and a plurality of low-side drivers for providing drive voltages for connection to respective phases of a polyphase motor, a plurality of predriver circuits producing predrive signals according to a commutation sequence connected to gates of respective the DMOS power drive transistors, and a multiplexer connected to selectively direct at least some of the predrive signals to an externally accessible port. The circuit also has a digital comparison circuit for receiving the at least some predrive signals and for producing a digital output having a signal state change time in dependence upon rise and fall times of the predrive signals.

According to still yet another broad aspect.of the invention, a method is presented for providing digital signals indicative of slew rates of motor driver signals. The method includes connecting a multiplexer to direct at least some of the driver signals to a multiplexer output port, and receiving the driver signals on the multiplexer output port and producing a digital output having signal changes in dependence upon rise and fall times of the driver signals.

According to still another broad aspect of the invention, a method is presented for providing digital signals indicative of slew rates of predrive signals in a motor driver circuit. The method include proving an integrated circuit chip including DMOS power driver transistors connected in an H-bridge configuration having a plurality of high-side drivers and a plurality of low-side drivers for providing drive voltages for connection to respective phases of a polyphase motor, a plurality of predriver circuits producing predrive signals according to a commutation sequence connected to gates of respective the DMOS power drive transistors, and a multiplexer connected to selectively direct at least some of the predrive signals to an externally accessible port. The method also includes providing a digital comparison circuit for receiving the at least some predrive signals and for producing a digital output having a signal state change time in dependence upon rise and fall times of the predrive signals.

BRIEF DESCRIPTION OF DRAWINGS

The invention is illustrated in the accompanying drawings, in which:

FIGS. 4A and 4B are a series of waveforms generated in the circuit combinations of FIGS. 2 and 3 for measuring the slew rate in a discharging mode of operation, in accordance with a preferred embodiment of the invention.

And FIGS. 5A and 5B are a series of waveforms generated in the circuit combinations of FIGS. 2 and 3 for measuring the slew rate in a charging mode of operation, in accordance with a preferred embodiment of the invention.

In the various drawings, like reference numerals are used to denote like or similar parts. Additionally, the drawings are not necessarily drawn to scale.

DETAILED DESCRIPTION

Figure 1:
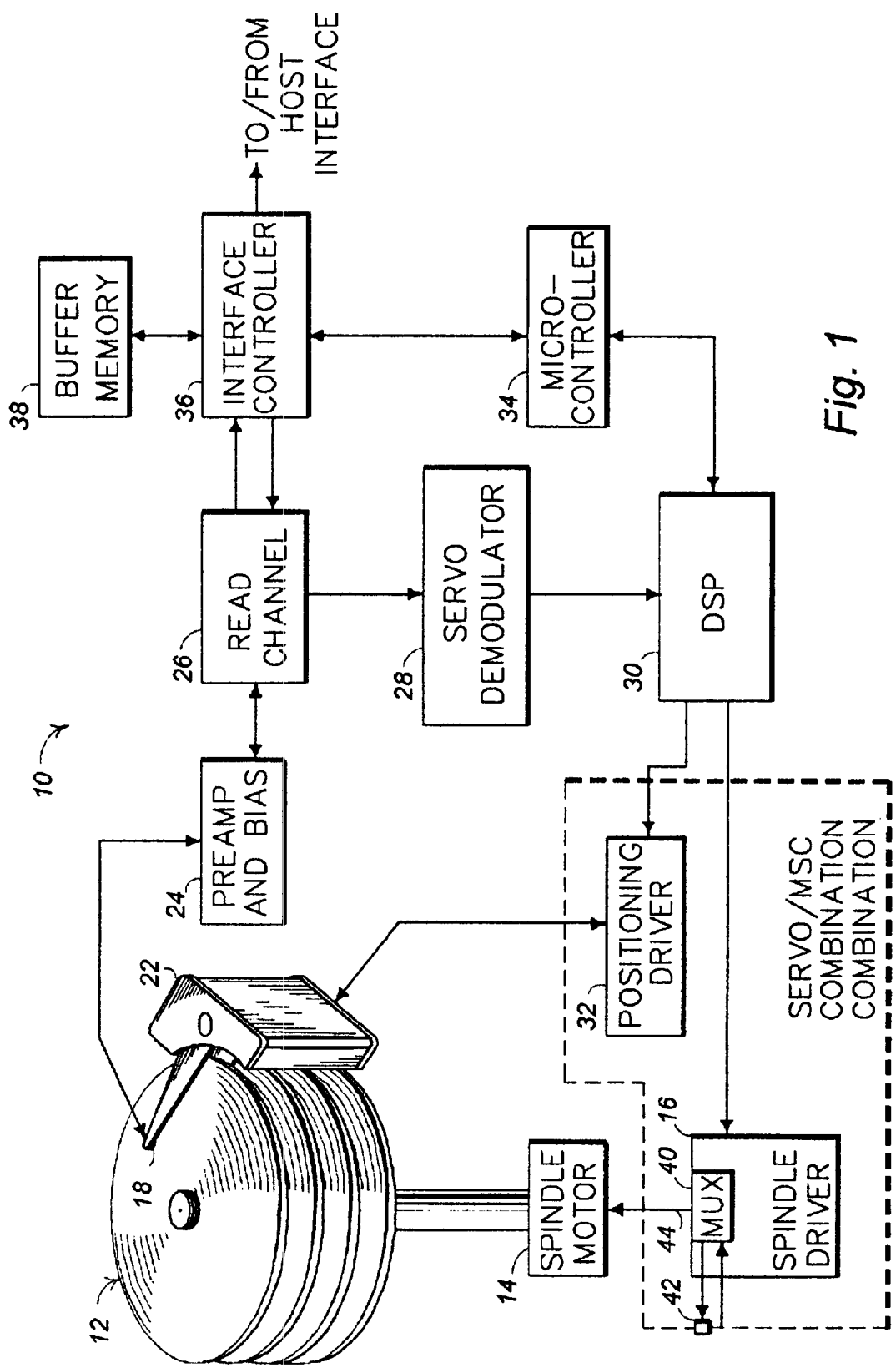
FIG. 1 is a block diagram of a generic disk drive system, illustrating the general environment in which the invention may be practiced, in accordance with a preferred embodiment of the invention.

FIG. 1 is a block diagram of a generic disk drive system 10, which represents the general environment in which the invention may be practiced. The system 10 includes a magnetic media disk 12 that is rotated by a spindle motor 14 and spindle driver circuit 16. As will be explained more fully below, the spindle driver circuit 16 may be supplied in various configurations, depending upon the needs of the particular user. Often, for example, the disk assembly, including, for example, the motor 14 and disk portions 12, 18, and 22, may be provided by a user, and the remaining driver, channel, and processing circuitry may be provided by a circuit vendor. The interface, however, between the spindle driver circuitry 16 and the spindle motor 14 may be supplied in various configurations. One configuration may be, for example, such that the user is permitted to provide its own H-bridge power driver section, for example, integrated into the spindle motor circuitry 14. Another configuration may be, for example, such that the circuit vendor is permitted to provide its own H-bridge power driver section integrated into the spindle driver circuitry 16. In either case, however, to properly test the driver circuitry, signals are typically examined at the interface between the output of the predriver transistors, which are in the spindle driver circuitry 16, and the H-bridge transistors, which may be either within the spindle driver transistors 16 or within the spindle motor 14.

The embodiment shown in FIG. 1 shows an embodiment in which the predriver and H-bridge power DMOS driver transistors are both contained within the spindle driver circuitry 16. To enable the signals at the output of the predriver circuits to be examined, a multiplexer (MUX) 40 is provided to selectively direct the predriver signals indicated, described below in detail, from gate predriver and logic circuits to an output pin, pad, or port 42, where they may be examined. In the event that the H-bridge power DMOS driver transistors are provided by the user, the multiplexer 40 may be unnecessary, and the output signals may be examined directly at the output pins of the spindle driver circuitry 16, represented by lines 44. It should be noted that the principles of the invention are equally applicable to either motor configuration, with appropriate modifications as indicated above.

A data transducer or head 18 is locatable along selectable radial tracks (not shown) of the disk 12 by a voice coil motor 22. The radial tracks may contain magnetic states that contain information about the tracks, such as track identification data, location information, synchronization data, as well as user data, and so forth. The head 18 is used both to record user data to and read user data back from the disk 12, as well as to detect signals that identify the tracks and sectors at which data is written, and to detect servo bursts that enable the head to be properly laterally aligned with the tracks of the disk 12, as below described.

Analog electrical signals that are generated by the head in response to the magnetic signals recorded on the disk 12 are preamplified by a preamplifier 24 for delivery to read channel circuitry 26. Servo signals, below described in detail, are detected and demodulated by one or more servo demodulator circuits 28 and processed by a digital signal processor (DSP) 30 to control the position of the head 18 via the positioning driver circuit 32. The servo data that is read and processed may be analog data that is interpreted by the DSP 30 for positioning the head 18.

A microcontroller 34 is typically provided to control the DSP 30, as well as an interface controller 36 to enable data to be passed to and from a host interface (not shown) in known manner. A data memory 38 may be provided, if desired, to buffer data being written to and read from the disk 12.

Figure 2:
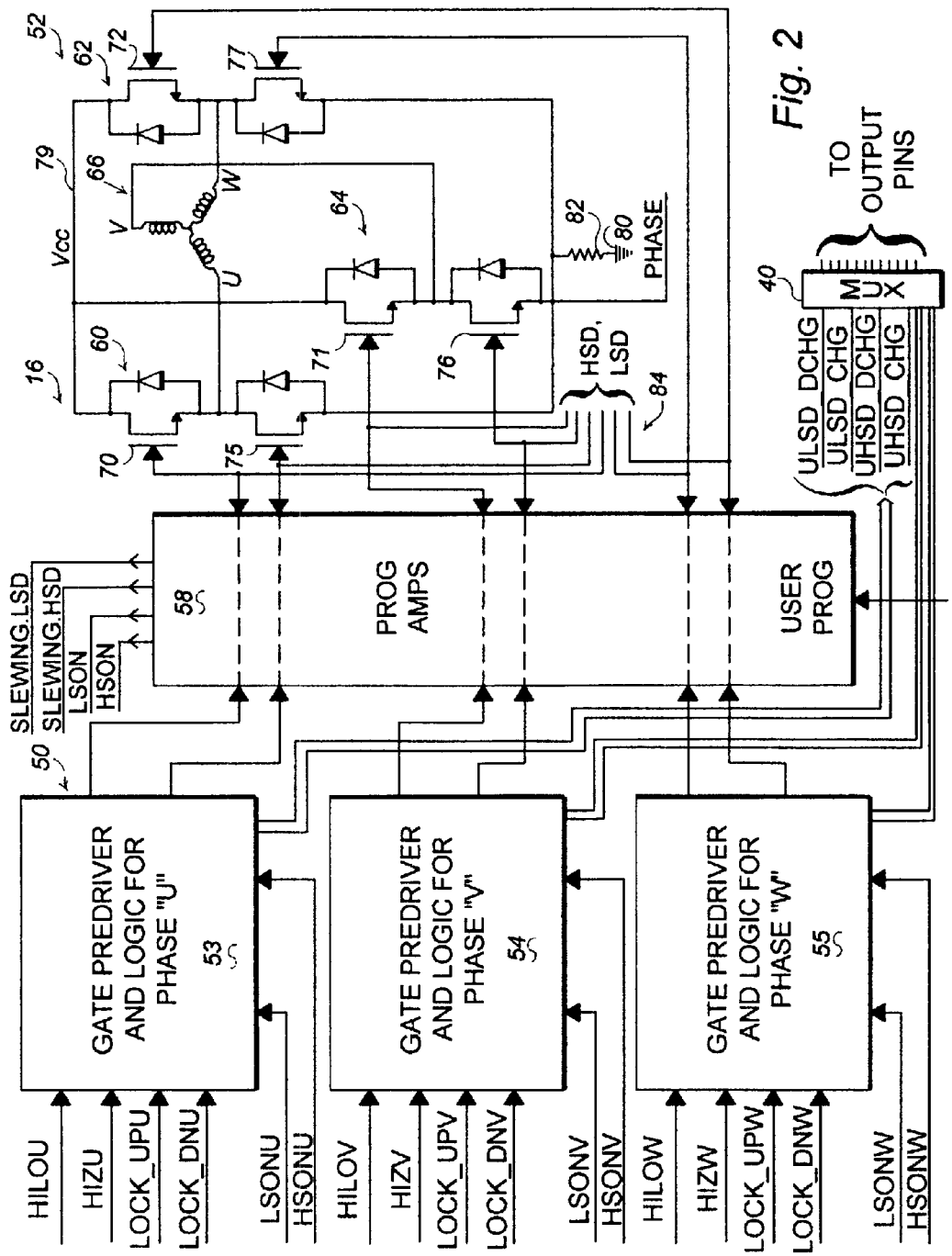
FIG. 2 is a block diagram of a circuit combination in which gate predrivers supply driving voltages to DMOS transistors of an H-bridge power driver for supplying drive voltages to windings of a three phase d-c motor with multiplexed signal lines for use in measuring the slew rate of the driving voltage, in accordance with a preferred embodiment of the invention.

Additional details of the predriver circuit 50 and H-bridge DMOS power driver transistor circuit 52 of the spindle driver circuit 16 are shown in FIG. 2, to which reference is now additionally made. In the three-phase system shown, the predriver circuit 50 has three gate predriver and logic circuits 53–55 for respective motor winding phases "U", "V", and "W". The gate predriver and logic circuits 53–55 receive respective signals HILOX, HIZX, LOCK_UP, LOCK_DN, LSON, and HSON, where "X" represents "U", "V", or "W" in the respective gate predriver and log circuits. The signals HILOX, HIZX, LOCK_UP, LOCK_DN, LSON, and HSON are described in detail below.

The outputs from the gate predriver and logic circuits 53–55 may be amplified by programmable amplifiers 58 for delivery respectively to the high and low side drivers of H-bridge DMOS power transistor pairs 60, 62, and 64. It should be noted that if user programmable amplifiers 58 are provided, which is the usual case, the current that is applied to the power DMOS power transistor pairs 60, 62, and 64 may be controlled or varied in many applications. This results in different rise and fall times for voltages that are applied to the gates of the power DMOS power transistor pairs 60, 62, and 64. This illustrates another reason that knowing the slew rate of the applied voltages is important in the operation of the circuit, to ensure that the operational constraints described above on the H-bridge power transistor pairs 60, 62, and 64 are not violated. The gate predriver and logic circuits 53–55 provide output signals "ULSD_CHG", "ULDS_DCHG", "UHSD_CHG", "UHSD_DCHG", "VLSD_CHG", "VLDS_DCHG", "VHSD_CHG", "VHSD_DCHG", "WLSD_CHG", "WLDS_DCHG", "WHSD_CHG", and "WHSD_DCHG" to a multiplexer (MUX) 40 to selectively direct the predriver signals indicated from the gate predriver and logic circuits 53–55 to the output port 42, only the signals from the "U" phase gate predriver circuit 53 being enumerated in the drawing for brevity. Additionally, signals "LSON", "HSON", "SLEWING.HSD", and "SLEWING.LSD" are developed by the programmable amplifiers 58 for use in the logic circuit 86, described below in detail.

The H-bridge power transistor pairs 60, 62, and 64 each include respective high-side driver transistors 70–72, and low side driver transistors 75–77 to respectively connect the various phases of the coils 66 to a power supply rail 79 and a ground potential 80, in accordance with the commutatively controlled signals from the predriver circuits 53–55. The low side connection includes a sense resistor 82 through which a current flows to develop a feedback voltage for control of the motor currents in known manner.

Figure 3:
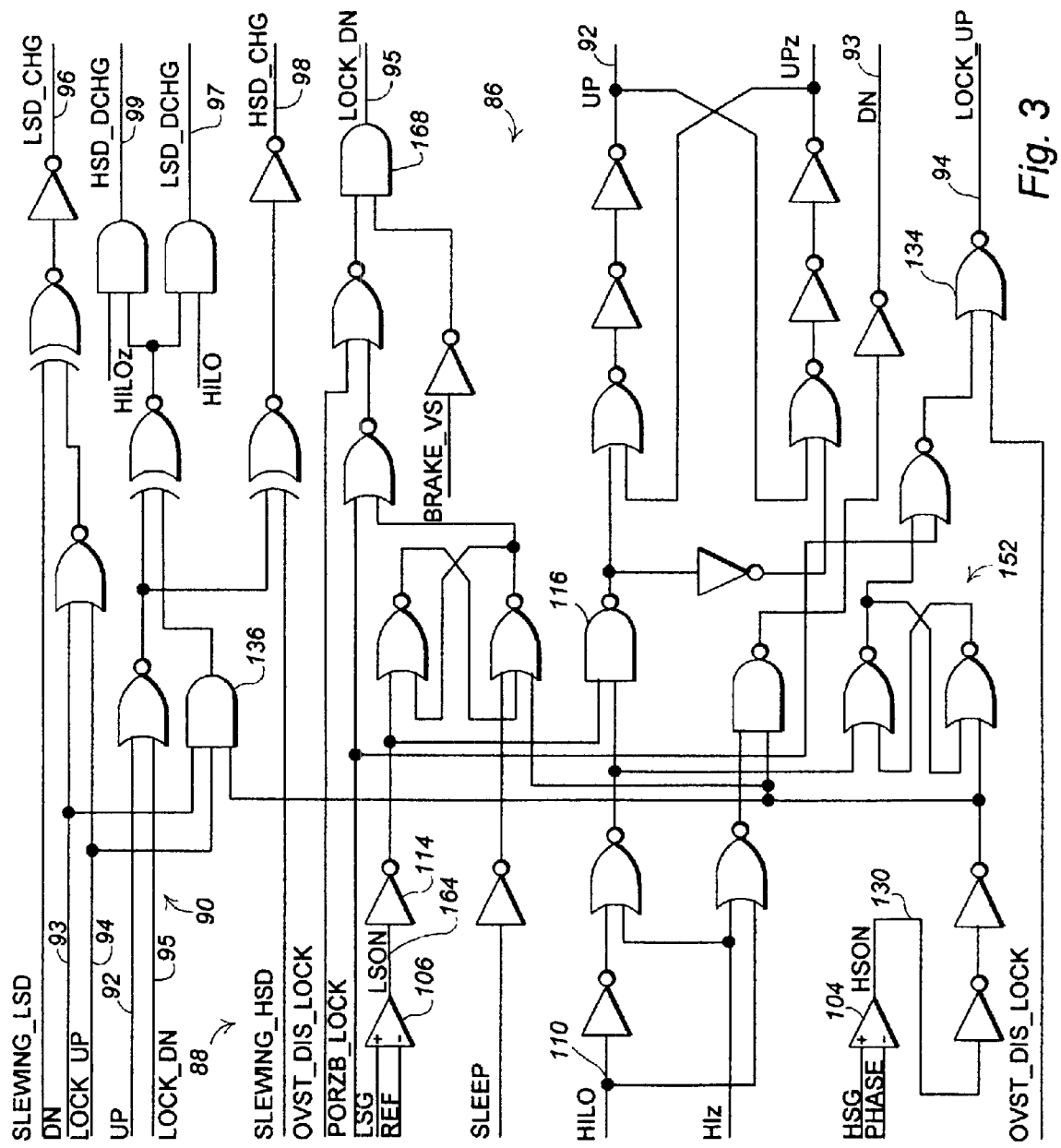
FIG. 3 is a schematic diagram of a circuit for use in conjunction with the circuit combination of FIG. 2 to determine the slew rate of the driving voltages, in accordance with a preferred embodiment of the invention.

In the embodiment illustrated, a number of lines 84 connect the gates of the DMOS power transistors 70–72 and 75–77 to provide the driving signals, HSG and LSG, of the gates of the respective high-side DMOS power transistors 70–72 and low-side DMOS power transistors 75–77 to the circuit of FIG. 3 to perform various parameter tests, including, for example, slew rate measurements, and so on. Additionally, the PHASE signal derived from the voltage developed across the sense resistor 82 may be also be provided to the circuit of FIG. 3, all as below described in detail. It should be noted that although all of the signals at the gates to the driver DMOS devices are brought to the external port, in some embodiments, it may be necessarily or desirable to bring out only a subset of the signals. For example, in some cases, it may be necessary to determine the slew rate of only one of the driving signals as a close approximation of each of the other non-measured signals. In such application, only the single driver signal need be directed to the circuit of the invention and to which the method of the invention is applied.

With reference now additionally to FIG. 3, a circuit 86 is shown for developing signals that can be used to develop digital data signals that can be used to indicate the charge and discharge times of the nodes at the output of the driver circuit, at the gates of the high and low side driver transistors. The circuit 86 has two portions, a lower circuit portion 88 that accepts as its inputs signals that exist or can be developed from the existing commutation and predriver circuits shown in FIG. 3 to develop "UP", "DN", "LOCK_UP", and "LOCK_DN" signals on respective lines 92–95 for use in the upper circuit portion 90, and an upper circuit portion 90 that generates output signals 96–99 that respectively indicate the timing of the low-side charge, LSD_CHG, low-side discharge, LSD_DCHG, high-side charge, HSD_CHG, and high-side discharge, HSD_DCHG.

The input signals "HILO" and "HIz" on lines 100 and 102 are derived from the predriver circuitry of the device with which the invention may be associated. An example of a suitable circuit may be seen, for example, in U.S. Pat. No. 6,236,174, assigned to the assignee hereof and incorporated herein by reference. More particularly, one of the signals 40, 42, and 44 of said U.S. Pat. No. 6,236,174, may be used, for example to provide the "HILO" signal on line 100 of the circuit 86. The "HIz" signal is merely the signal that is used to drive the output states to a high impedance, and the "SLEEP" signal is merely the system signal that forces the system into a "sleep" mode. Although a particular circuit example is shown in said U.S. Pat. No. 6,236,174, it is understood that the invention may be used in conjunction with other types of spindle predriver circuits as well.

The "HSG", "LSG", and "PHASE" signals are obtained from the gates of the high and low side H-bridge driver transistors 70–72 and 75–77, respectively, and from the sense resistor 82, shown in FIG. 2, via the multiplexer 40, and are used to develop the "HSON" and "LSON" signals. Thus, when the gates of the high side drivers of the H-bridge transistors is larger than the phase voltage, "HSON" is high, and when the gates of the low side drivers of the H-bridge transistors is larger than a reference voltage, "LSON" is high. In the embodiment shown, this is determined by comparators 104 and 106. The circuit 86 may be replicated for each phase to be measured. For example, if the circuit 86 shown in FIG. 3 is associated with the DMOS transistors 60 of phase "U", two additional circuits may be instantiated to generate charge and discharge timing signals for the DMOS transistors respectively of phases "V" and "W". The remainder of the signals into and out of the circuit 86 are externally developed.

The "OVST_DIS_LOCK" signal is used to lock out driver testing signals, and the "PORZB_LOCK" signal is a power on reset locking signal. Both the "OVST_DIS_LOCK" signal and the "PORZB_LOCK" are only peripherally related to the operation of the present invention, and may be omitted if desired in those applications in which such testing and resetting signals are not employed.

Figure 4B:
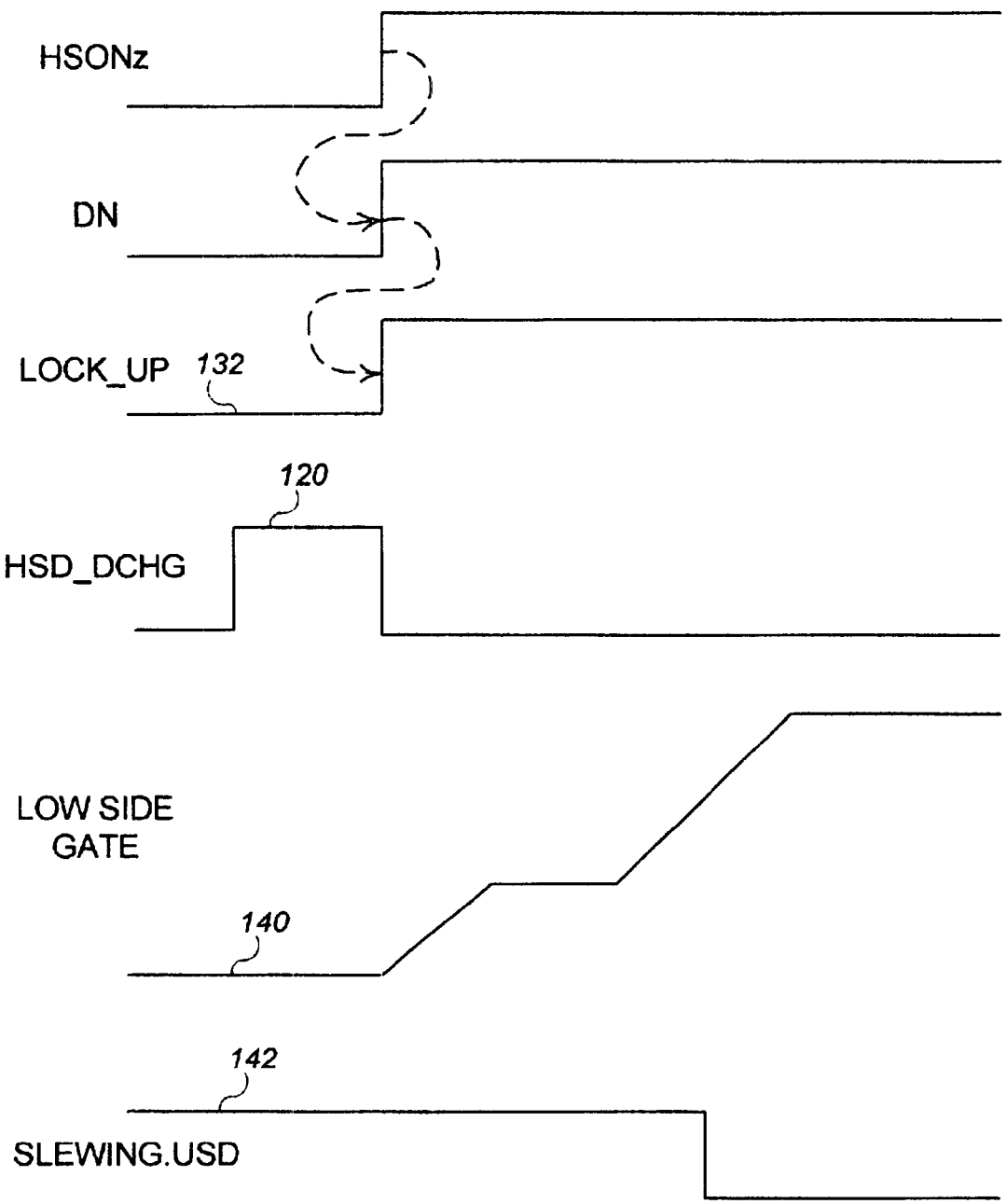

The operation of the circuit 86, in one application, to measure the discharge time, and provide a digital representation thereof, is illustrated with additional reference now to FIG. 4. The particular digital representation illustrated is that of a high-side discharge with output on line 99, but a similar analysis can be made for a low-side discharge with output on line 97. The discharge cycle is initiated by the signal HILO 108, applied to input line 110, changing state from high to low. This initiates the turn off of the driving voltage to the high side driver with which the circuit 86 is associated (which may be in the embodiment illustrated, for example, the high-side driver transistor of driver "U"). The voltage waveform 112, representing the gate voltage, then begins to fall. Since the low side driver should not be on (lest a "shoot through" condition exists), the low state of LSON is inverted by inverter 114, so that the output of the NAND gate 116 is determined by the state of HILO 108, which is initially high. This causes the normally high UP 118 signal on line 92 to change to low. At the same time, the LOCK_DN signal 120 on line 95 also changes from a normally high state to a low state. This causes the HSD_DCHG signal 122 on line 99 to change from low to high.

As the gate voltage signal, HSG, 112, continues to drop, it eventually falls below the phase voltage 124, for example, at point 126. The comparator 104 changes the state of the HSON signal 128 from high to low on input line 130. This changes the state of the LOCK_UP signal 132 on line 94 via NOR gate 132, and changes the state of the HSD_DCHG signal 120 via AND gate 136. It can therefore be seen that the time that the HSD_DSCG signal 120 remains high corresponds to the discharge time of the HSG signal 112 from its high state to the time that its value corresponds to the PHASE voltage 124, which corresponds to the discharge slew rate.

To complete the cycle, when the HSON signal 128 changes state from high to low, the low side gate voltage 140 begins to ramp up. All during this cycle, the SLEWING.USD signal 142 remains high.

Figure 5B:
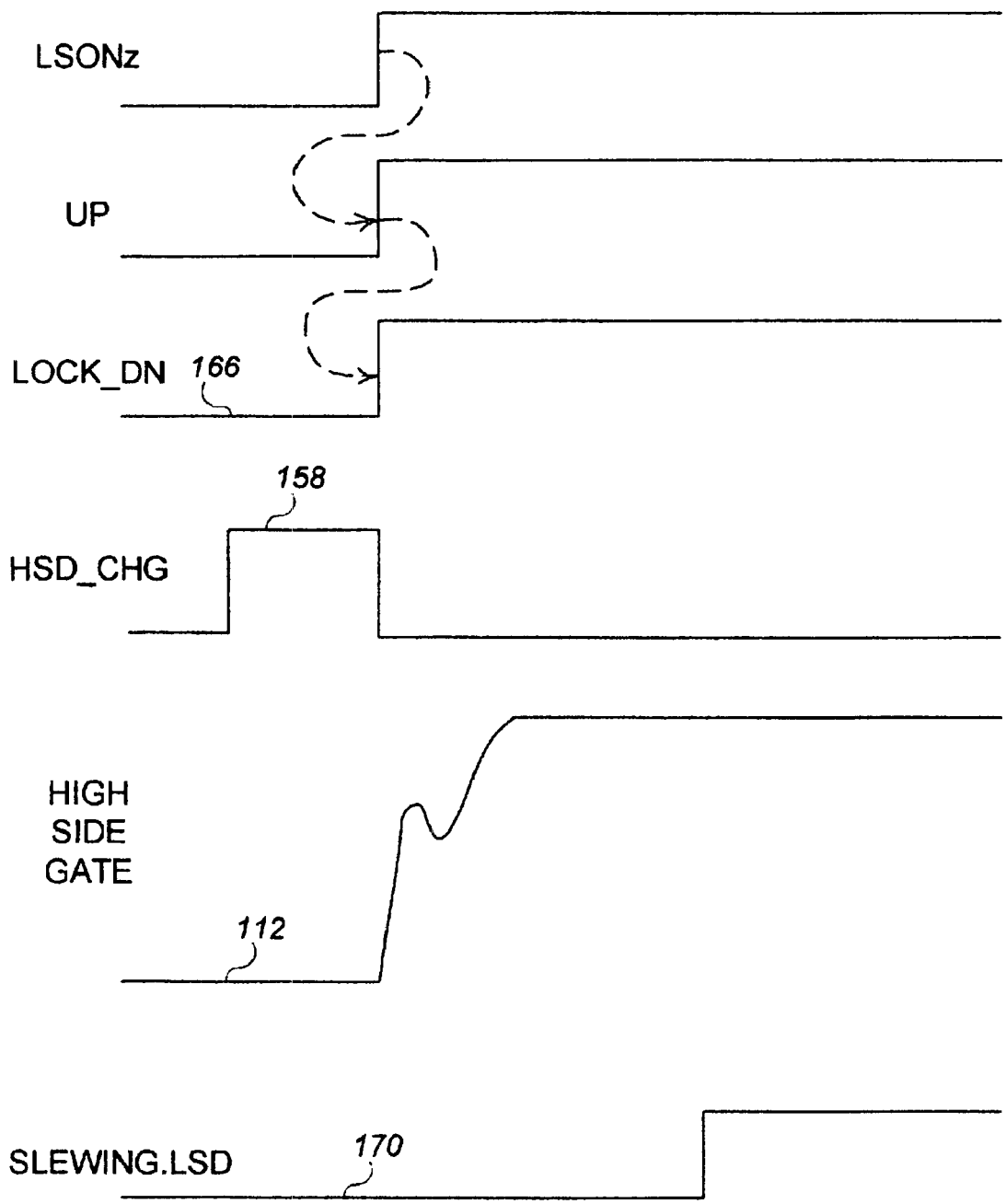

The operation of the circuit 86, in another application, to measure the charge time, and provide a digital representation thereof, is illustrated with additional reference now to FIG. 5. The particular digital representation illustrated is that of a low-side charge with output on line 96, but a similar analysis can be made for a high-side charge with output on line 98. At the outset, the signal HILO 108, applied to input line 110, changes state from low to high. This initiates the turn on of the driving voltage to the low side driver with which the circuit 86 is associated (which again may be in the embodiment illustrated, for example, one of the low side driver transistors of driver "U"). The LSG voltage waveform 140, representing the gate voltage, then begins to fall. Since the high side driver should not be on (lest a "shoot through" condition exists), the high state of HSON is applied to AND gate 136 and to flip-flop 152, causing the normally low DN signal 154 on line 93 to change to high. At the same time, the LOCK_UP signal 156 on line 94 also changes from a normally high state to a low state. This causes the LSD_CHG signal 158 on line 96 to change from low to high.

As the gate voltage signal, LSG, 150 continues to drop, it eventually falls below the value of a reference voltage, for example, at point 160. The comparator 106 changes the state of the LSON signal 162 from high to low on input line 164. This changes the state of the LOCK_DN signal 166 on line 95 via AND gate 168, and changes the state of the LSD_CHG signal 158 on line 96. It can therefore be seen that the time that the LSD_CHG signal 158 remains high is for a time corresponding to the discharge time of the LSG signal 150 from its high state to the time that its value corresponds to the reference voltage, which corresponds to the charge slew rate.

To complete the cycle, when the LSON signal 162 changes state from high to low, the high side gate voltage 112 begins to ramp up. All during this cycle, the SLEWING.LSD signal 170 remains high.

It should be appreciated that although the circuit has been illustrated and described in conjunction with DMOS power transistors in H-bridge configuration for use in measuring characteristics of the driver signals on the gates thereof in a spindle driver motor of a mass data storage device, the principles of the invention can be equally applied to other similar motors, such as those adapted to drive the voice-coil motor of such mass data storage devices, or the like.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A circuit for providing digital signals indicative of slew rates of motor predriver signals, comprising:
    a multiplexer connected to direct at least some of said predriver signals to a multiplexer output port;
    and a digital comparison circuit for receiving said predriver signals on said multiplexer output port and for producing a digital output having signal changes in dependence solely upon rise and fall times of said predriver signals.

2. The circuit of claim 1 said signal changes in said digital output change state for at time corresponding to said rise and fall times of said predriver signals.

3. The circuit of claim 1 wherein said motor predriver signals are predriver signals for application to DMOS power transistors connected in an H-bridge configuration.

4. The circuit of claim 3 wherein said DMOS power transistors are power transistors for a spindle motor in a mass data storage device.

5. The circuit of claim 3 wherein said DMOS power transistors are power transistors for a VCM motor in a mass data storage device.

6. A circuit combination for providing digital signals indicative of slew rates of drive signals provided to H-bridge power drive transistors of a motor of a mass data storage device, comprising:

a plurality of predriver circuits producing predrive signals according to a commutation sequence for connection to respective said power drive transistors;

a multiplexer connected to selectively direct at least some of said drive signals to a multiplexer output port;

and a digital comparison circuit for receiving said at least some drive signals from said multiplexer output port and for producing a digital output having signal changes in dependence solely upon rise and fall times of said predriver output signals.

7. The circuit combination of claim 6 wherein said signal changes in said digital output change state for at time correspond to said rise and fall times of said drive signals.

8. The circuit combination of claim 6 wherein said power drive transistors are DMOS power driver transistors.

9. The circuit combination of claim 8 wherein said DMOS power drive transistors are power transistors for a spindle motor in a mass data storage device.

10. The circuit combination of claim 8 wherein said DMOS power drive transistors are power transistors for a VCM motor in a mass data storage device.

11. A circuit combination for providing digital signals indicative of slew rates of predrive signals in a motor driver circuit, comprising:

1) an integrated circuit chip including:
   a) DMOS power driver transistors connected in an H-bridge configuration having a plurality of high-side drivers and a plurality of low-side drivers for providing drive voltages for connection to respective phases of a polyphase motor;
   b) a plurality of predriver circuits producing predrive signals according to a commutation sequence connected to gates of respective said DMOS power driver transistors; and
   c) a multiplexer connected to selectively direct at least some of said predrive signals to an externally accessible port; and 2) a digital comparison circuit for receiving said at least some predrive signals and for producing a digital output having a signal state change time in dependence solely upon rise and fall times of said predrive signals.

12. The circuit of claim 11 said signal changes in said digital output change state for at time corresponding to said rise and fall times of said predriver signals.

13. The circuit of claim 11 wherein said DMOS power driver transistors are power transistors for a spindle motor in a mass data storage device.

14. The circuit of claim 11 wherein said DMOS power driver transistors are power transistors for a VCM motor in a mass data storage device.

15. A method for providing digital signals indicative of slew rates of motor driver signals, comprising:

connecting a multiplexer to direct at least some of said driver signals to a multiplexer output port;

and receiving said driver signals on said multiplexer output port and producing a digital output having signal changes in dependence upon rise and fall times of said driver signals.

16. The method of claim 15 wherein said motor driver signals are predriver signals for application to DMOS power transistor gates connected in an H-bridge configuration.

17. The method of claim 16 wherein said DMOS power transistors are power transistors for a spindle motor in a mass data storage device.

18. A method for providing digital signals indicative of slew rates of predrive signals in a motor driver circuit, comprising:

1) proving an integrated circuit chip including:
   a) DMOS power driver transistors connected in an H-bridge configuration having a plurality of high-side drivers and a plurality of low-side drivers for providing drive voltages for connection to respective phases of a polyphase motor;
   b) a plurality of predriver circuits producing predrive signals according to a commutation sequence connected to gates of respective said DMOS power drive transistors; and
   c) a multiplexer connected to selectively direct at least some of said predrive signals to an externally accessible port; and 2) providing a digital comparison circuit for receiving said at least some predrive signals and for producing a digital output having a signal state change time in dependence solely upon rise and fall times of said predrive signals.

19. The method of claim 18 wherein said DMOS power driver transistors are power transistors for a spindle motor in a mass data storage device.

20. The method of claim 18 wherein said DMOS power driver transistors are power transistors for a VCM motor in a mass data storage device.

* * * * *